United States Patent
Arikado

(10) Patent No.: US 7,047,632 B2
(45) Date of Patent: May 23, 2006

(54) METHOD OF MOUNTING ELECTRONIC COMPONENTS

(75) Inventor: Kazuo Arikado, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 573 days.

(21) Appl. No.: 10/267,853

(22) Filed: Oct. 10, 2002

(65) Prior Publication Data
US 2003/0071109 A1    Apr. 17, 2003

(30) Foreign Application Priority Data
Oct. 12, 2001    (JP) .............................. 2001-314889

(51) Int. Cl.
*H05K 3/30* (2006.01)

(52) U.S. Cl. ............................ 29/832; 29/825; 29/833; 29/934; 29/836

(58) Field of Classification Search .................. 29/825, 29/832, 833, 840, 834, 836

See application file for complete search history.

(56) References Cited

U.S. PATENT DOCUMENTS

| | | | | |
|---|---|---|---|---|
| 3,465,408 A | * | 9/1969 | Clark et al. | 29/564.6 |
| 4,139,881 A | * | 2/1979 | Shimizu et al. | 361/760 |
| 4,515,304 A | * | 5/1985 | Berger | 228/136 |
| 4,761,881 A | * | 8/1988 | Bora et al. | 29/840 |
| 4,841,633 A | * | 6/1989 | Kinugawa | 29/837 |
| 5,839,187 A | | 11/1998 | Sato et al. | |
| 5,876,556 A | | 3/1999 | Takanami | |

FOREIGN PATENT DOCUMENTS

JP    09-097805    4/1997

* cited by examiner

*Primary Examiner*—Carl J. Arbes
(74) *Attorney, Agent, or Firm*—Wenderoth, Lind & Ponack, L.L.P.

(57) ABSTRACT

An electronic component mounting apparatus removes an electronic component supplied to a part feeder in face-up status and mounts it to a board. A flip-chip supplied from a first holding table is removed and flipped over by a take-out head and then delivered to a mounting head, which mounts the component on the board. A die supplied from a second holding table is picked up directly and mounted to the board by the mounting head. This structure allows a single mounting apparatus to perform both die bonding and flip-chip bonding.

13 Claims, 10 Drawing Sheets

METHOD OF MOUNTING ELECTRONIC COMPONENTS

FIELD OF THE INVENTION

The present invention relates to a mounting apparatus that removes electronic components cut out from a wafer and bonded to a pressure sensitive adhesive sheet and then mounts the components to a board, and it also relates to a method of mounting electronic components.

BACKGROUND OF THE INVENTION

In a process of manufacturing semiconductor devices, a semiconductor chip is cut out from a wafer comprising a number of chips. The wafer is bonded to an adhesive-sheet, and cut-out chips are detached from the adhesive-sheet and then picked up. When those chips are bonded to the adhesive sheet, their active faces face upward, i.e., they are in face-up status.

There are two types of methods for mounting semiconductor chips: one is a flip-chip bonding method; and the other one is a die-bonding method. The flip chip bonding method mounts a chip with its active face facing downward, i.e., in face down status, on a board, such as a flip-chip having bumps on its active face. The die bonding method mounts a semiconductor chip with its active face facing upward on a board such as a lead-frame.

A conventional electronic component mounting apparatus, however, cannot simultaneously perform mounting of the semiconductor chips having fronts and backs in different directions. Therefore, the die bonding method and the flip chip bonding method have each required a dedicated mounting apparatus.

SUMMARY OF THE INVENTION

The present invention addresses the problem discussed above, and aims to provide a mounting apparatus for mounting electronic components. This mounting apparatus removes electronic components supplied with their faces facing upward, and mounts them to target locations. The mounting device has a face-up mounting function for mounting a component with its face facing upward, and also has a face-down mounting function for mounting a component flipped-over so that its face faces downward. The mounting apparatus is equipped with a take-out head and a mounting head. The take-out head picks up an electronic component supplied with its face facing upward and flips it over. The mounting head picks up and mounts an electronic component supplied with its face facing upward onto a target location in the case of the face-up mounting. In the case of the face-down mounting, the mounting head picks up the electronic component flipped over by the take-out head and mounts it onto a target location.

DETAILED DESCRIPTION OF THE EXEMPLARY EMBODIMENTS

Exemplary embodiments of the present invention are described hereinafter with reference to the accompanying drawings.

Exemplary Embodiment 1

Figure 1:
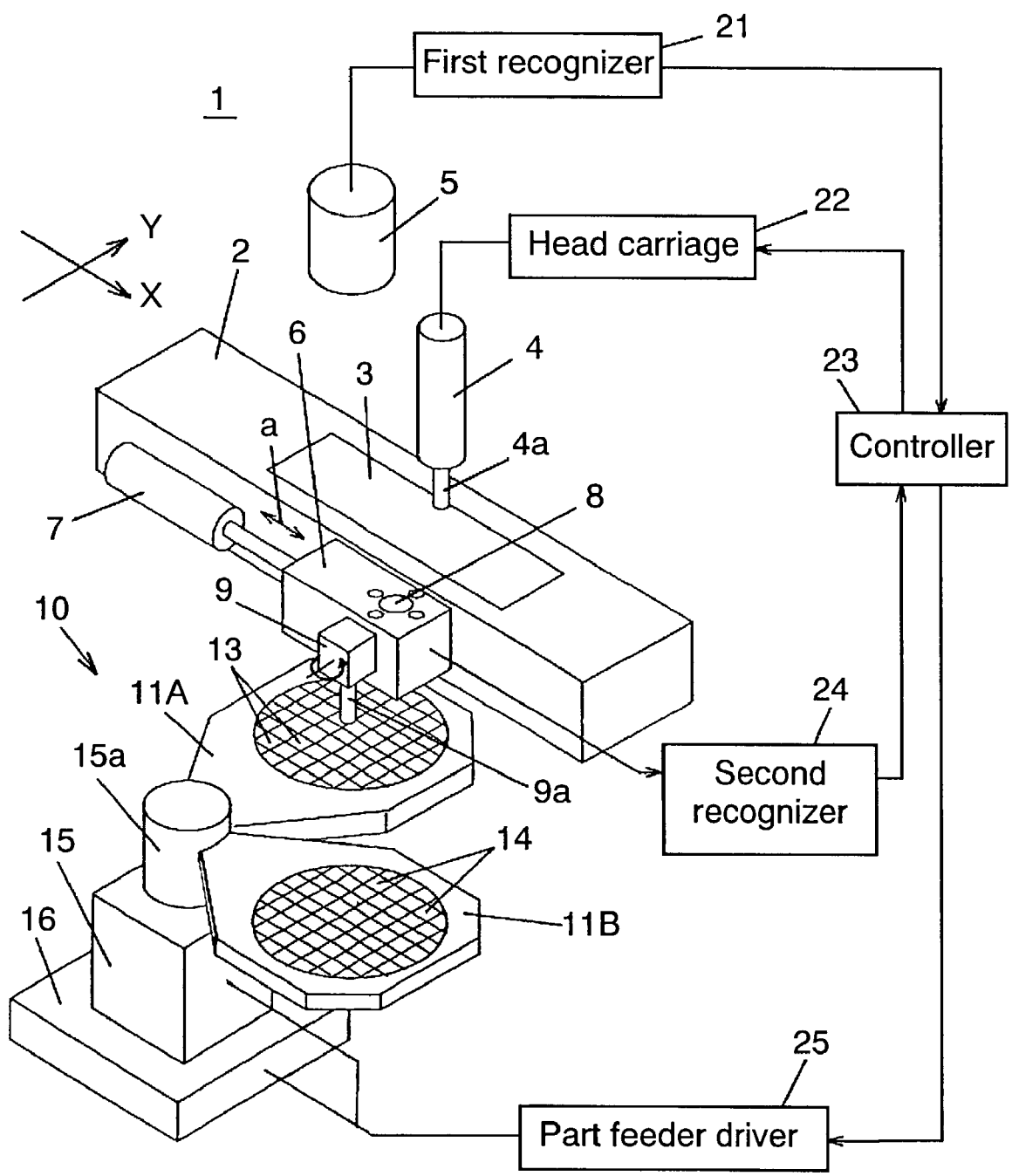
FIG. 1 is a perspective view of an electronic component mounting apparatus in accordance with a first exemplary embodiment of the present invention.
Figure 2A:
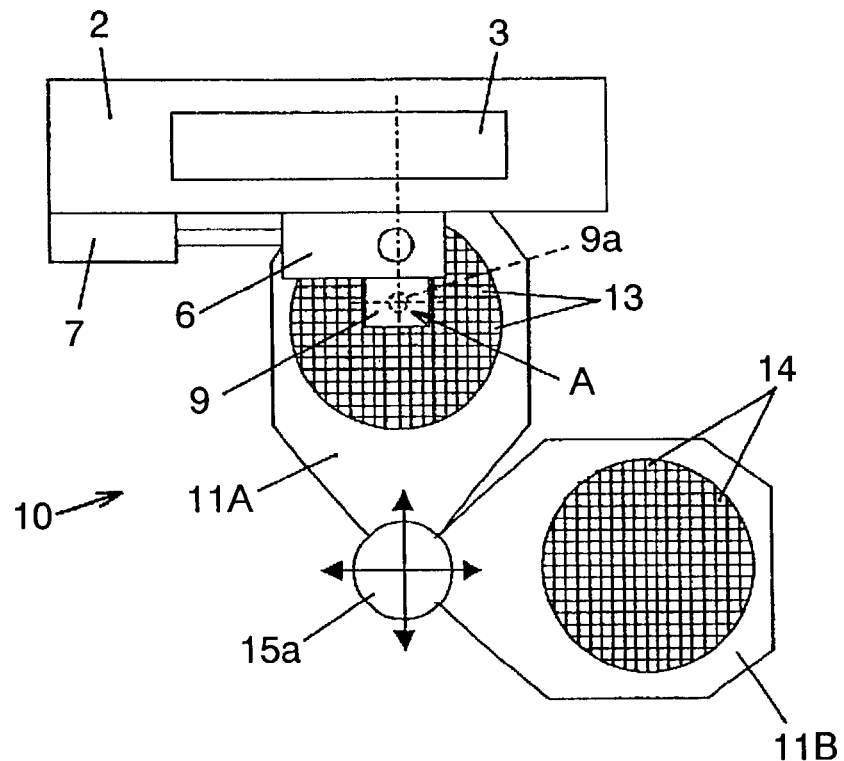
FIG. 2A and FIG. 2B are plan views of the mounting apparatus in accordance with the first exemplary embodiment of the present invention.
Figure 2B:
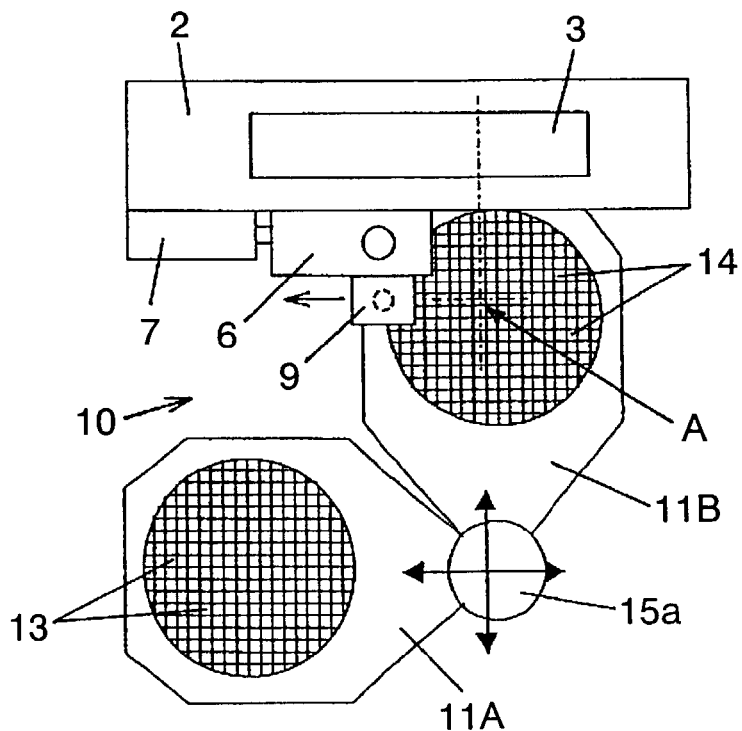

FIG. 1 is a perspective view of an electronic component mounting apparatus in accordance with a first exemplary embodiment. FIG. 2A and FIG. 2B are plan views of the mounting apparatus in accordance with the first exemplary embodiment. FIGS. 3A, 3B, 4A, 4B, 5A, 5B and 6 illustrate steps of a manufacturing method in accordance with the first embodiment.

First, the mounting apparatus is described with reference to FIGS. 1, 2A and 2B. In FIG. 1, a mounting apparatus 1 includes a board transfer mechanism 2 disposed along an X direction. Mechanism 2 transfers a board 3 and positions board 3 at a predetermined mounting position. A mounting head 4 including a mounting nozzle 4a is movably disposed above mechanism 2, and it is moved by a head carriage 22.

Mounting head 4 holds an electronic component supplied from a part-feeder 10 (described later) with mounting nozzle 4a, and mounts the electronic component to a target location on board 3. The electronic component supplied is, e.g., a flip chip 13 having bumps on its active face or a die 14. There are two methods of mounting the component with mounting nozzle 4a: (a) nozzle 4a directly picks up a component from part feeder 10; and (b) a take-out head picks up a component and delivers it to nozzle 4a for mounting. Method (b) is detailed below. A selection of one of the two methods depends on the type of electronic component to be mounted.

Beside board transfer mechanism 2, a movable block (movable member) 6 is disposed, and the movable block 6 is moved by a cylinder 7 along directions shown by arrow "a" in FIG. 1. On a lateral face of movable block 6, a take-out head 9 including a take-out nozzle 9a is disposed. Take-out head 9 picks up and removes chip 13 from part feeder 10. Take-out head 9 can rotate about a Y-axis (horizontal direction). Rotation of take-out head 9 by 180 degrees rotates flip chip 13 held by take-out nozzle 9a about the Y-axis and moves flip chip 13 up and down. This mechanism flips the chip 13 over and moves the chip 13 to a location at which chip 13 is supposed to be delivered to mounting head 4.

Next, the part feeder 10 is described. Part feeder 10 includes two component-holding tables, i.e., a first holding table 11A and a second holding table 11B. Both of the tables are coupled with a shaft 15a of a table 15, which is mounted on an XY table 16.

A part-feeder driver 25 drives XY table 16 and table 15, so that both of the holding tables 11A and 11B rotate about shaft 15a, and at the same time, move horizontally in the XY directions. Driver 25 is controlled by a controller 23.

Above a pick up position, at which take-out head 9 or mounting head 4 picks up a component, a first camera 5 is prepared for obtaining an image of flip chip 13 or die 14 supplied from part feeder 10 to take-out head 9 or mounting head 4. An image obtained by the first camera 5 undergoes a recognition process in a first recognizer 21, so that the position of flip chip 13 or die 14 in part feeder 10 is recognized.

A second camera 8 is built into movable block 6 for obtaining an image of flip chip 13 held by mounting head 4 above camera 8. The image obtained by second camera 8 undergoes a recognition process in a second recognizer 24, so that the position of flip chip 13 held by mounting head 4 is recognized.

The recognition results produced by the first and second recognizers 21 and 24 are sent to a controller 23. Based on the recognition result of the first recognizer 21, controller 23 controls part feeder driver 25, so that die 14 or flip chip 13 is exactly positioned at the pick up position. From the pick up position, mounting head 4 picks up die 14 with mounting nozzle 4a, or take-out head 9 picks up flip chip 13 with take-out nozzle 9a. Based on the recognition result of the second recognizer 24, controller 23 controls head carriage 22, so that a travelling amount of mounting head 4 is corrected, and head 4 mounts flip chip 13 at an exact target location of board 3.

First table 11A holds flip chip 13 which has bumps on its active face and is bonded to an adhesive sheet 12 with its active face facing upward. (Refer to FIGS. 3A and 3B.) First table 11A supplies flip chip 13 in face-up status to take-out head 9. Second table 11B holds die 14 bonded to adhesive sheet 12 with its active face facing upward. (Refer to FIGS. 5A and 5B.) Second table 11B supplies die 14 in face-up status to mounting head 4.

In mounting of flip chip 13 onto board 3, as shown in FIG. 2A, shaft 15a of table 15 is rotated so that first table 11A moves to pick-up position "A" where take-out head 9 is supposed to pick up chip 13. Then XY table 16 moves first table 11A along the XY direction, so that a target flip-chip 13, among other flip chips 13 held by table 11A, is positioned at pick up position A. Then the target chip 13 is removed by nozzle 9a and flipped over, so that chip 13 is delivered to mounting head 4 in face-down status.

In mounting of die 14 onto board 3, as shown in FIG. 2B, second table 11B is moved to pick up position "A" in the same way, and target die 14, among other dies 14 held by table 11B, is positioned at pick up position A as discussed above. Then the target die 14 is picked up by mounting nozzle 4a directly and mounted onto board 3 with the die 14 in face up status.

In other words, the mounting apparatus has a face-up mounting function of mounting an electronic component onto a board in face-up status, as well as a face-down mounting function of mounting an electronic component flipped over onto a board in face-down status. In both the face-up mounting and the face-down mounting, flip chip 13 or die 14 is positioned at pick-up position A, which is common to both takeout head 9 and mounting head 4, before chip 13 or die 14 is picked up.

In the case of the face-up mounting shown in FIG. 2B, cylinder 7 is driven to retract movable-block 6 in the direction of the arrow shown in FIG. 2B, and retains take-out head 9 in a safe place, at which head 9 does not prevent mounting head 4 from picking up die 14 positioned at pick-up position A. Cylinder 7 thus works as a refuge mechanism for moving movable block 6 to a safe place.

Figure 3A:
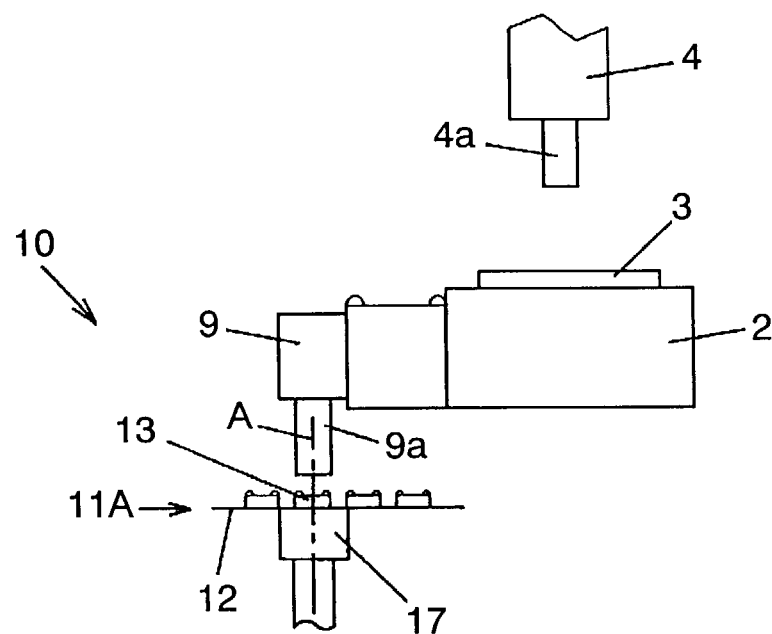
FIG. 3A and FIG. 3B illustrate steps of a manufacturing method in accordance with the first embodiment.

Operation of the mounting apparatus structured above is described with reference to FIG. 3A through FIG. 6. In FIG. 3A, board 3 is positioned on board transfer mechanism 2, and mounting head 4 including mounting nozzle 4a is placed above transfer mechanism 2. At pick-up position A in part feeder 10, first table 11A is positioned, and flip chips 13 bonded to adhesive sheet 12 are held in face-up status, i.e., with bumps facing upward. Among those flip chips 13, a target chip 13 intended to be removed in this pick-up operation is positioned at pick-up position A.

Take-out nozzle 9a of head 9 disposed above this flip chip 13 moves down and up, thereby detaching chip 13 from adhesive sheet 12 and picking up chip 13. At this time, a sheet peel-off mechanism 17 is placed underneath the back face of sheet 12 for attracting and holding sheet 12 by suction.

Figure 3B:
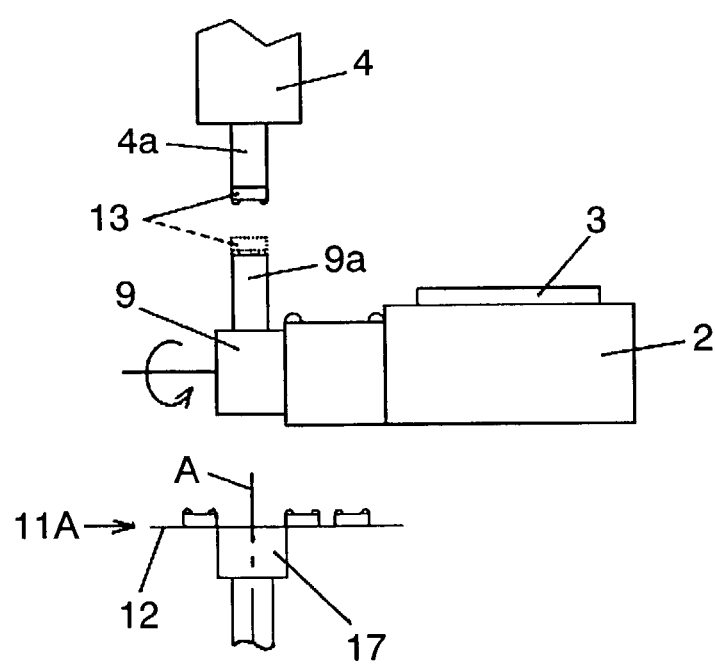

Then take-out head 9 is rotated 180 degrees to be positioned upside down as shown in FIG. 3B, and so that take-out nozzle 9a faces upward. This action flips over chip 13 held by nozzle 9a and, as a result, the active face of chip 13 faces downward, i.e., chip 13 is positioned in a face-down status. Then chip 13 is delivered to mounting nozzle 4a of head 4 while maintaining its face-down status.

Figure 4A:
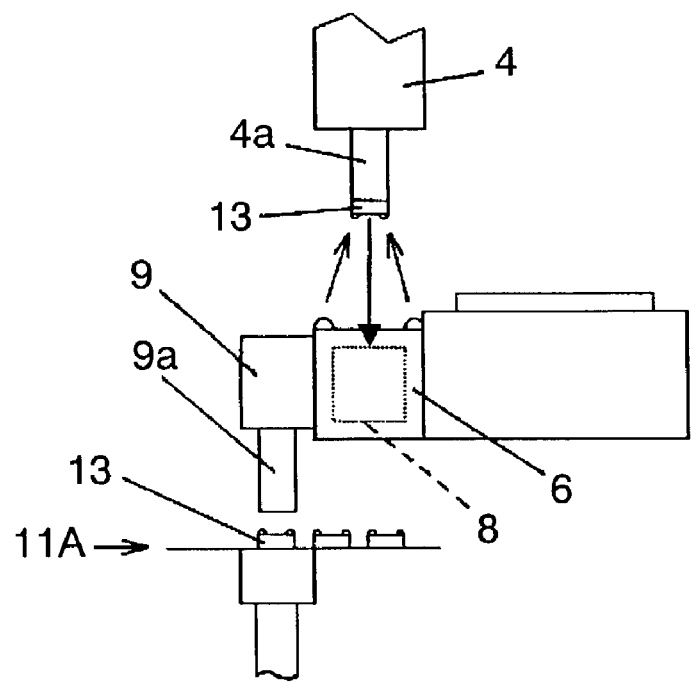
FIG. 4A and FIG. 4B illustrate steps of the manufacturing method in accordance with the first embodiment.

Next, as shown in FIG. 4A, mounting head 4 holding flip chip 13 moves above second camera 8 built into movable block 6, and camera 8 shoots chip 13 from below; namely, an image of the active face of chip 13 is obtained. This image undergoes the recognition process at the second recognizer 24 (FIG. 1), so that the position of flip chip 13 is recognized.

Figure 4B:
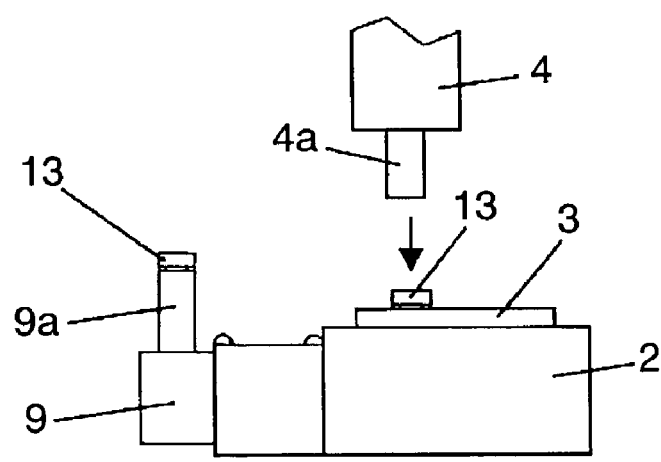
Figure 4B:
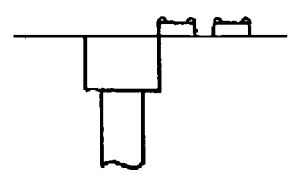

Then mounting head 4 moves above board 3 as shown in FIG. 4B, and mounts flip chip 13 held by nozzle 4a to a target location on board 3 with its active face facing downward. At this time, in FIG. 4A, controller 23 controls head carriage 22 based on the recognition result of chip 13 by recognizer 24, thereby correcting the travelling amount of mounting head 4. During this operation, take-out head 9 removes another flip chip 13 from first table 11A.

Figure 5A:
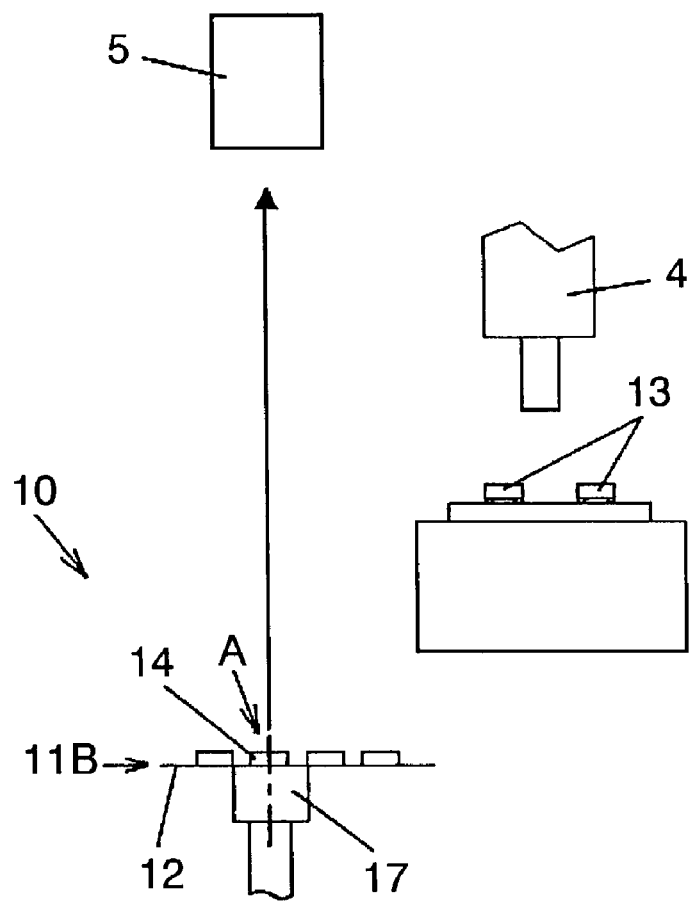
FIG. 5A and FIG. 5B illustrate steps of the manufacturing method in accordance with the first embodiment.
Figure 5B:
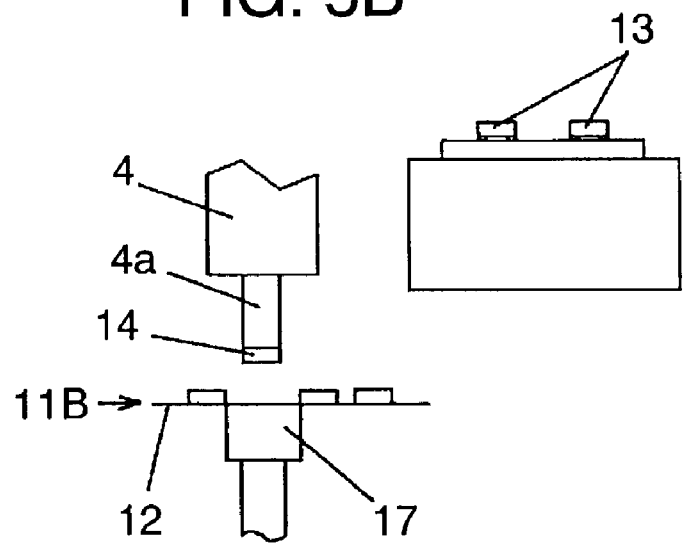

Following the mounting of chip 13, die 14 is mounted on top of chip 13 such that die 14 is overlaid on chip 13, i.e., stuck-die mounting is carried out. As shown in FIG. 5A, flip chip 13 has been mounted on board 3 in the face-down status. Before die 14 is removed from second table 11B, movable block 6 is moved back by cylinder 7 to move take-out head 9 to a safe place, at which head 9 does not prevent mounting head 4 from picking up die 14 positioned at the pick-up position.

Die 14 bonded to adhesive sheet 12 is held on second table 11B at pick-up position A, and first camera 5 positioned above die 14 shoots die 14. Based on this image, first recognizer 21 recognizes the position of die 14. Controller 23 controls part feeder driver 25 based on the recognition result, so that die 14 is exactly positioned at pick-up position A.

Next, mounting head 4 moves to part feeder 10 and moves down and up, so that die 14 is detached from adhesive sheet 12 and picked up with nozzle 4a. At this time, sheet peel-off mechanism 17 is placed underneath the back face of sheet 12 for attracting and holding sheet 12 by suction.

Figure 6:
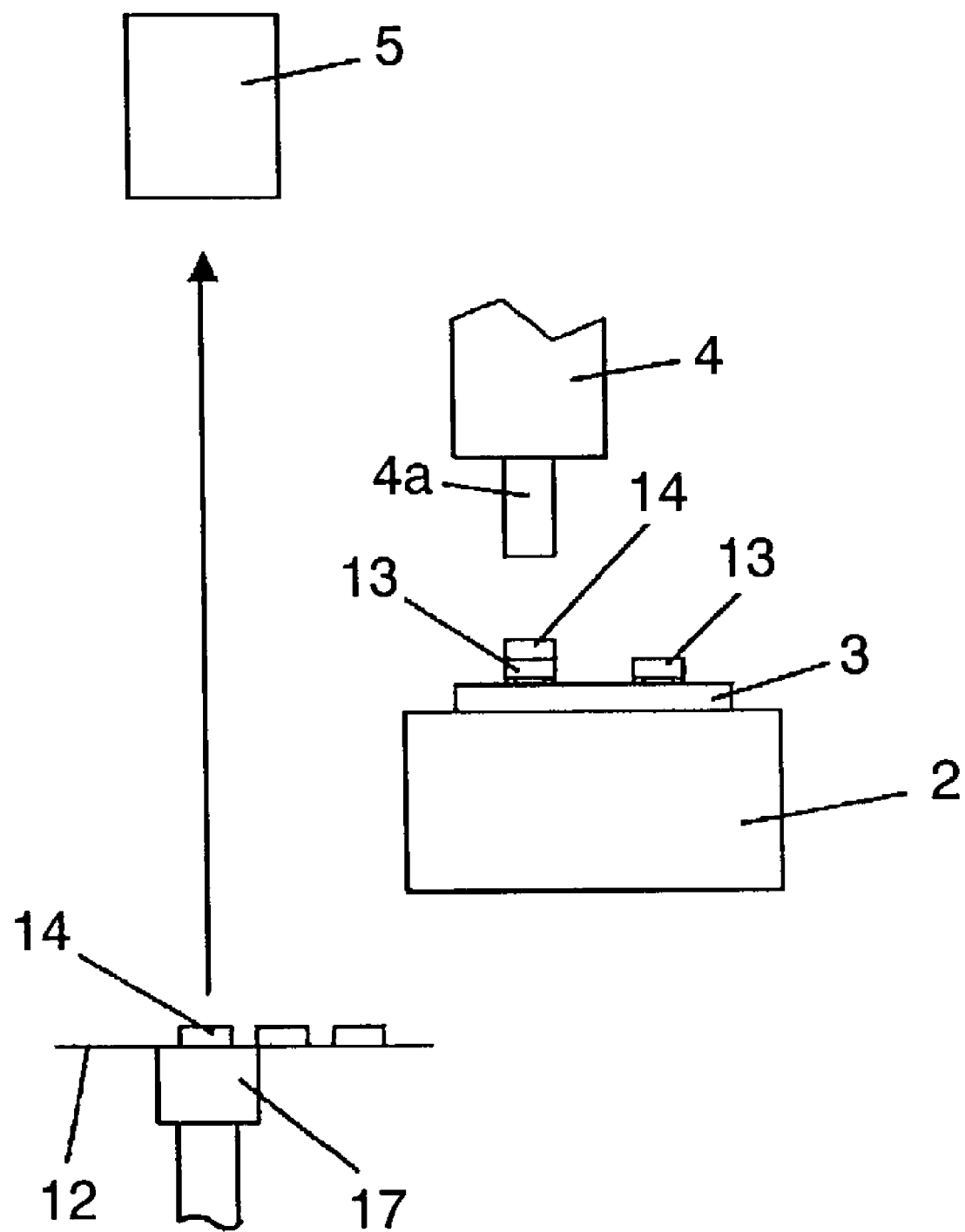
FIG. 6 illustrates steps of the manufacturing method in accordance with the first embodiment.

After that, mounting head 4 holding die 14 moves to a position above board 3 on board transfer mechanism 2 as shown in FIG. 6. Then head 4 mounts die 14 with its face facing upward on the upper face of flip chip 13 which is already mounted on board 3 via bumps formed on its active face. This is called stuck-die mounting. After the stuck-die mounting, die 14 is coupled to board 3 with wire-bonding.

Exemplary Embodiment 2

Figure 7:
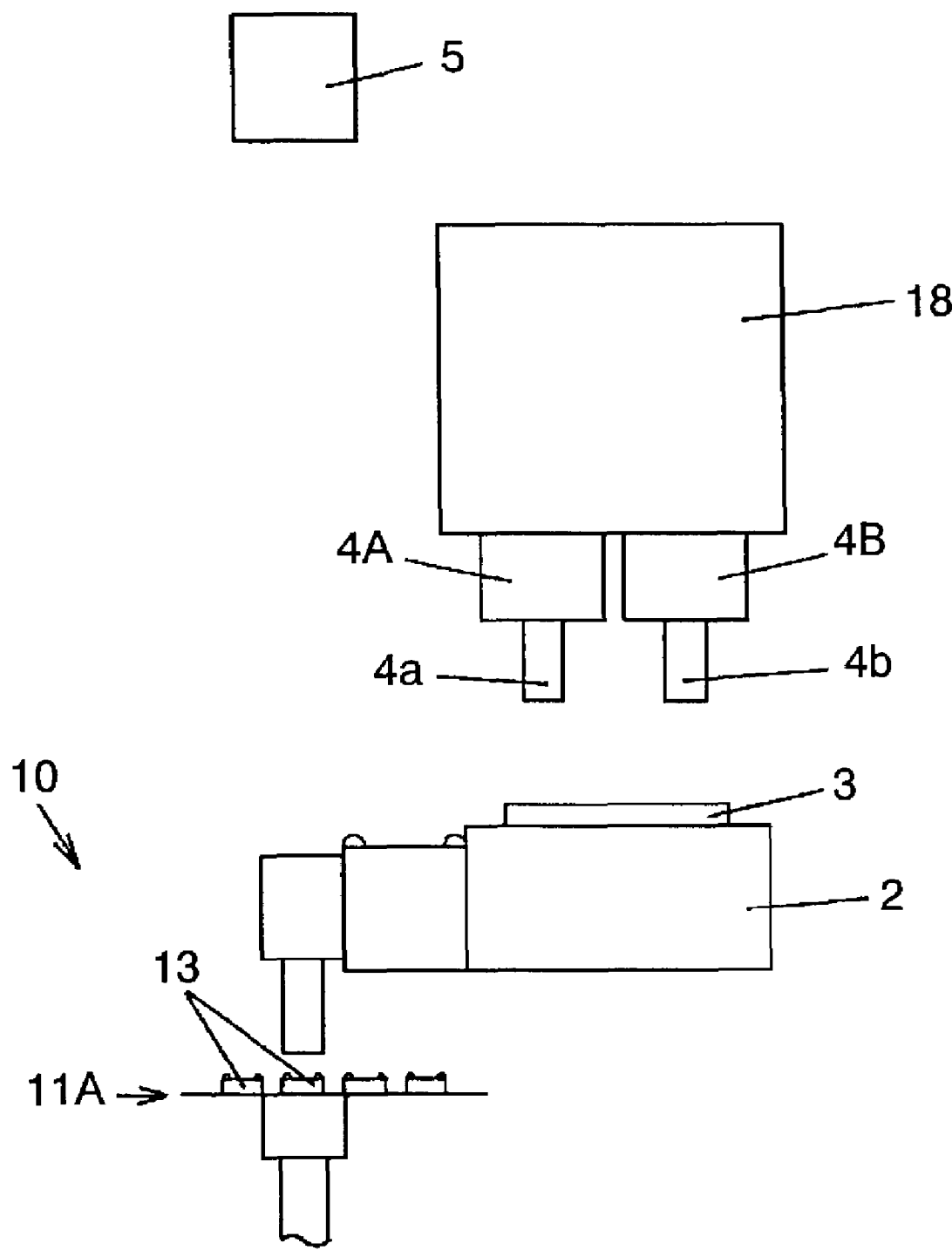
FIG. 7 is a partial sectional view of a mounting apparatus in accordance with a second exemplary embodiment of the present invention.
Figure 8A:
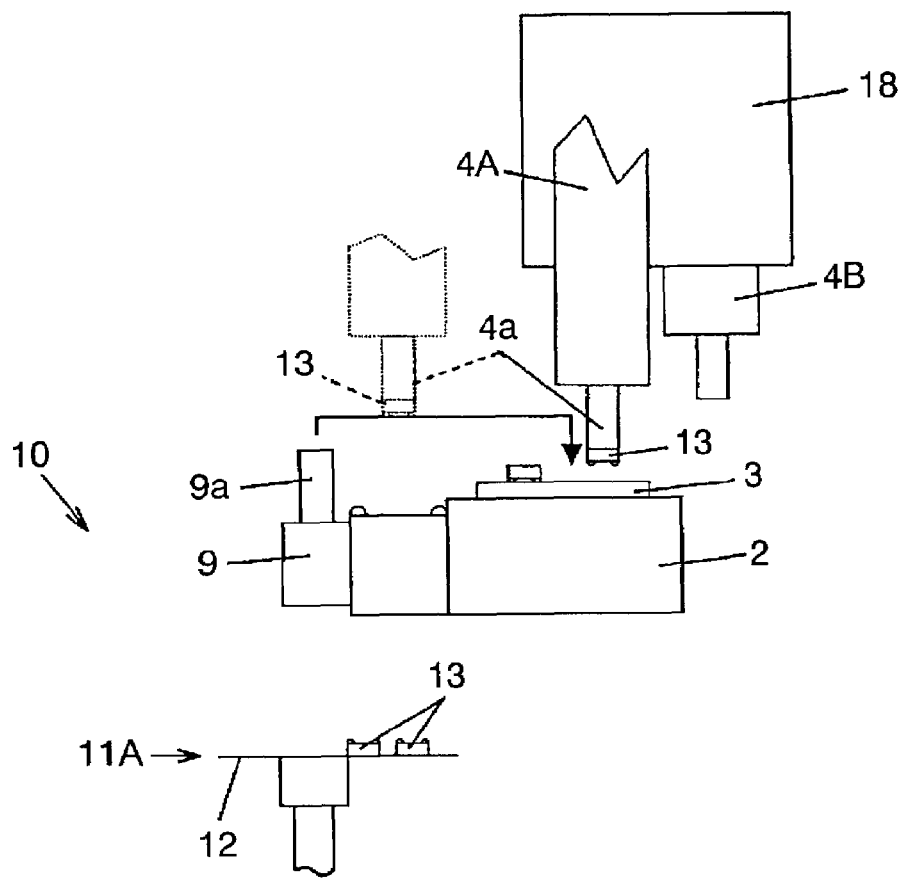
FIG. 8A and FIG. 8B illustrate steps of a manufacturing method in accordance with the second exemplary embodiment.
Figure 8B:
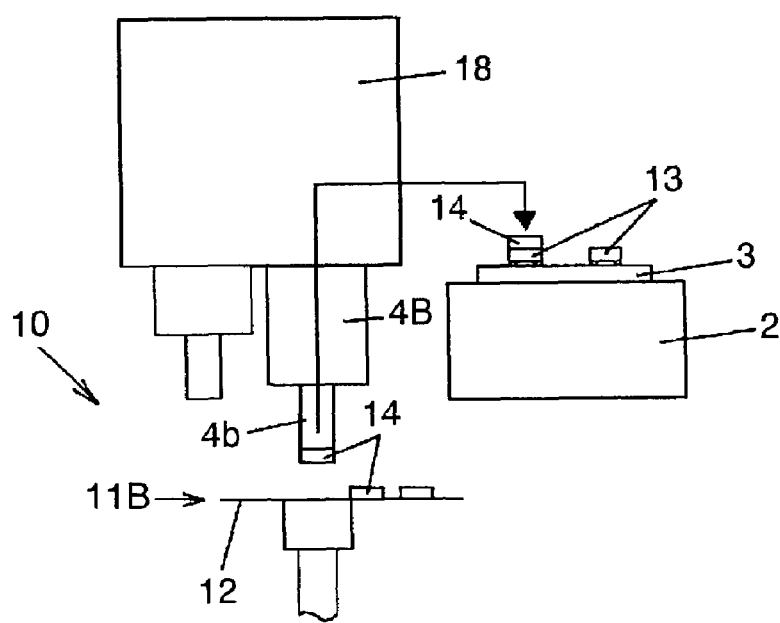

FIG. 7 is a partial sectional view of a mounting apparatus in accordance with a second exemplary embodiment of the present invention. FIG. 8 shows steps of a manufacturing method in accordance with the second exemplary embodiment. In this second embodiment, a mounting apparatus equipped with a multi-unit mounting head 18 is described. Multi-unit mounting head 18 includes first mounting head 4B having first nozzle 4b which holds die 14 in the case of face-up mounting, and second mounting head 4A having second nozzle 4a which holds flip chip 13 in the case of face-down mounting. In the second embodiment, first camera 5 disposed above chip 13 or die 14 shoots chip 13 or die 14 for recognizing its position when it is picked up from part feeder 10.

Next, a method of mounting an electronic component is described hereinafter. In mounting of flip chip 13 with its active face facing downward (in face-down status) onto board 3, take-out nozzle 9a removes chip 13 from first table 11A in face-up status. Then chip 13 is flipped over, and second nozzle 4a of second mounting head 4A mounts chip 13 flipped over to a target location on board 3 positioned on board transfer mechanism 2.

In mounting of die 14 on top of flip chip 13 already mounted on board 3 in the face-up status, first nozzle 4b of first mounting head 4B picks up die 14 from second table 11B, and mounts die 14 on chip 13 in the same way as demonstrated in the first embodiment.

Exemplary Embodiment 3

Figure 9A:
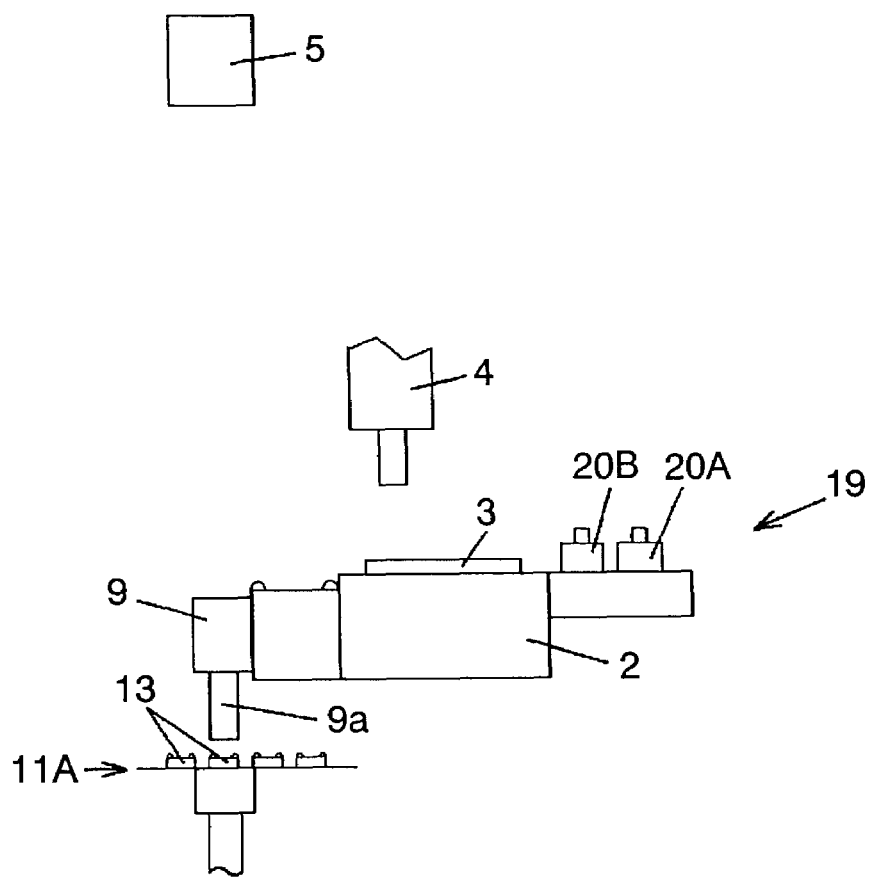
FIG. 9A and FIG. 9B illustrate steps of a manufacturing method in accordance with a third exemplary embodiment of the present invention.
Figure 9B:
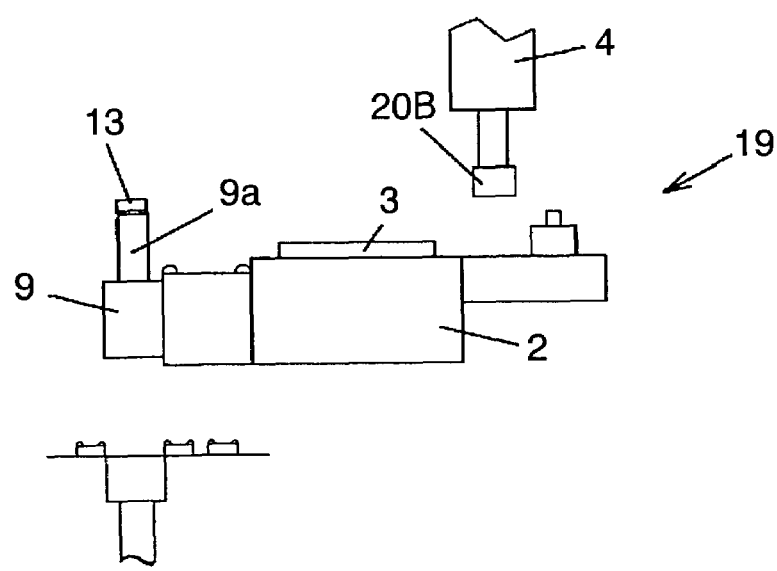

FIG. 9A, FIG. 9B and FIG. 10 illustrate steps of a method of mounting electronic components in accordance with a third embodiment. In this third embodiment, mounting head 4 has a nozzle replacement mechanism for changing between plural detachable replacement nozzles. To be more specific, replacement nozzles are manufactured in different shapes and sizes depending on the electronic components intended to be handled by the nozzles, and the nozzles can be selectively fitted to a suction port located at the lower end of mounting head 4.

As shown in FIG. 9A, nozzle holder 19 is prepared on a lateral face of board transfer mechanism 2. Nozzle holder 19 has a first replacement nozzle 20A and a second replacement nozzle 20B corresponding to die 14 and flip chip 13, respectively. Mounting head 4 accesses nozzle holder 19 for replacing a nozzle, so that either one of the second replacement nozzle 20B and first replacement nozzle 20A can be replaced with the other at the nozzle port disposed at the lower end of mounting head 4.

Figure 10A:
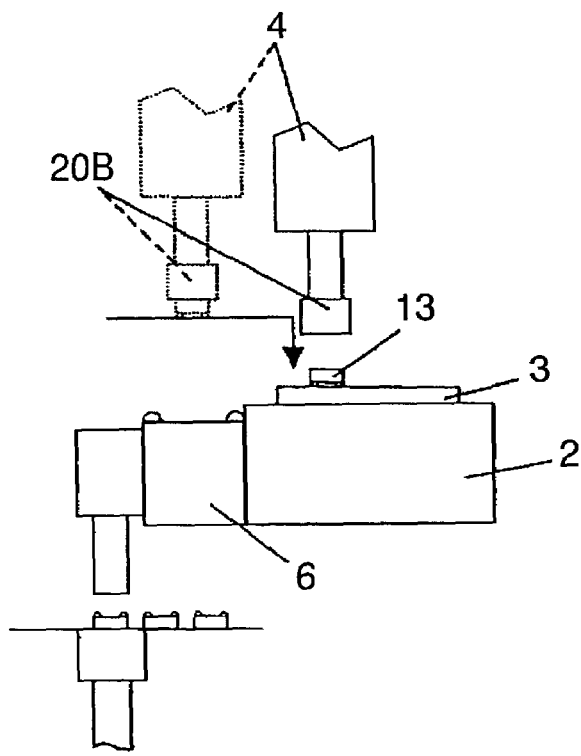
FIG. 10A and FIG. 10B illustrate steps of the manufacturing method in accordance with the third embodiment.

In mounting of flip chip 13 in the face-down status, take-out head 9 removes chip 13 from first table 11A as shown in FIG. 9A. Then chip 13 is flipped over, and mounting head 4 is moved to nozzle holder 19 for fitting second replacement nozzle 20B to its lower end as shown in FIG. 9B. Next, flip chip 13 held by head 9 in the face-up status is attracted and held by suction by second replacement nozzle 20B of mounting head 4. Then as shown in FIG. 10A, second camera 8 positioned above movable block 6 shoots chip 13 for recognizing the position of chip 13. After that, mounting head 4 moves to a position above board 3 and mounts chip 13 to a target location.

Figure 10B:
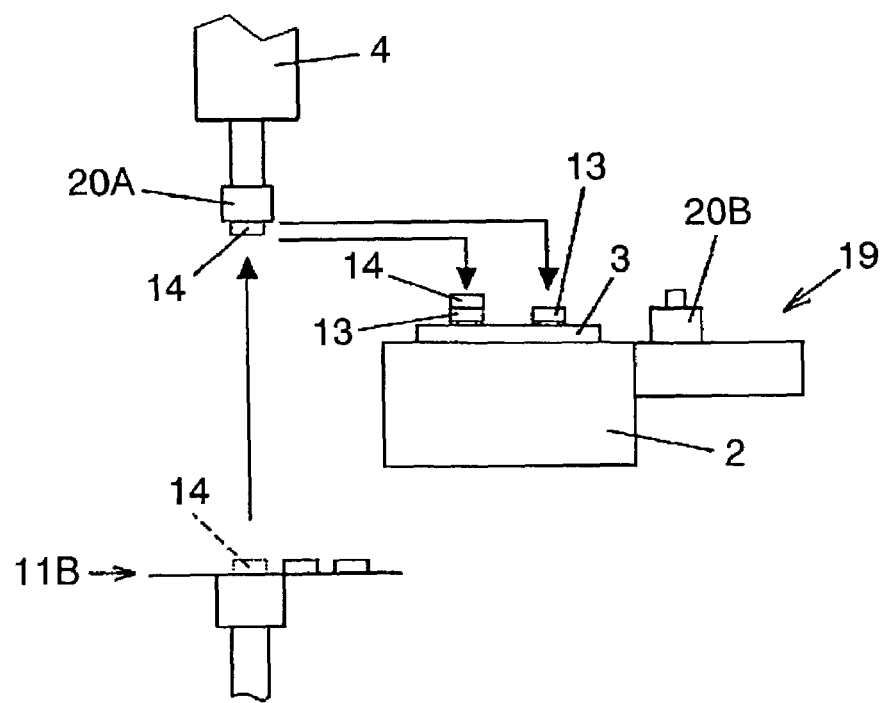

Then as shown in FIG. 10B, second replacement nozzle 20B placed in head 4 is replaced with first replacement nozzle 20A, which attracts and holds die 14 by suction from second table 11B. Mounting head 4 then moves to a position above board 3 and mounts die 14 on top of the already-mounted flip chip 13.

According to the present invention, the mounting apparatus is equipped with a take-out head and a mounting head. The take-out head picks up an electronic component supplied in face-up status and flips it over. On the other hand, the mounting head picks up an electronic component supplied in the face-up status and mounts it to a target location in the case of face-up mounting. The mounting head also picks up the electronic component flipped over by the take-out head and mounts it to a target location in the case of face-down mounting. Therefore, the single mounting apparatus can perform both face-up mounting and face-down mounting; namely, the mounting apparatus can perform both die-bonding and flip-chip bonding.

What is claimed is:

1. An electronic component mounting method for mounting electronic components in face-up and face-down conditions to a board, said electronic component mounting method comprising:

picking up a first selected electronic component supplied in face-up status, and flipping the first selected electronic component over so that the first selected electronic component is placed in a face-down status, and then mounting the first selected electronic component at a first target location in the face-down status; and picking up a second selected electronic component supplied in face-up status and mounting the second selected electronic component to a second target location in the face-up status.

2. An electronic component mounting method of claim 1, further comprising selectively supplying the first and second selected electronic components to a common pick-up position by operating a part feeder to selectively position the first and second selected electronic components at the common pick-up position.

3. An electronic component mounting method of claim 2, wherein said supplying of the first selected electronic component to the common pick up position comprises positioning a first electronic component-holding section of the part feeder by rotating the first electronic component-holding section about a shaft; and said supplying of the second selected electronic component to the common pick up position comprises positioning a second electronic component-holding section of the part feeder by rotating the second electronic component-holding section about the shaft.

4. The electronic component mounting method of claim 2, further comprising operating a first camera to obtain an image of one of the first and second selected electronic components while the one of the first and second electronic components is held on the part feeder;

recognizing a position of the one of the first and second electronic components held on the part feeder based on the image obtained by the first camera, and producing a first recognition result;

operating a second camera to obtain an image of the first selected electronic component while the first selected electronic component is held by the mounting head;

recognizing a position of the first electronic component held by the mounting head based on the image obtained by the second camera, and producing a second recognition result; and controlling the part feeder based on the first recognition result, and correcting a traveling amount of the mounting head based on the second recognition result.

5. The electronic component mounting method of claim 4, wherein the take-out head and the second camera are mounted to a movable member that is movable between a first position in which the take-out head can pick up the first selected electronic component at a common pick-up position, and a second position in which the take-out head is separated from the first position and allows the mounting head to pick up the second selected electronic component at the common pick-up position; and further comprising moving the movable member from the first position to the second position.

6. The electronic component mounting method of claim 2, wherein moving the take-out head from a first position in which it can pick up the first selected electronic component at the common pick-up position, to a second position in which the take-out head is separated from the first position and allows the mounting head to pick up the second selected electronic component at the common pick-up position.

7. An electronic component mounting method of claim 1, wherein said picking up and flipping of the first selected electronic component comprises operating a take-out head to pick up and flip the first selected electronic component;

said mounting of the first selected electronic component comprises operating a mounting head to receive the first selected electronic component from the take-out head and then mounting the first selected electronic component onto a board in the face-down status; and said picking up and mounting of the second selected electronic component comprises operating the mounting head to pick up the second selected electronic component and then mount the second selected electronic component onto the board in face-up status.

8. An electronic component mounting method of claim 1, wherein said picking up and flipping of the first selected electronic component comprises operating a take-out head to pick up and flip the first selected electronic component;

said mounting of the first selected electronic component comprises operating a first nozzle of a multi-unit mounting head to receive the first selected electronic component from the take-out head and then mounting the first selected electronic component onto a board in the face-down status; and said picking up and mounting of the second selected electronic component comprises operating a second nozzle of the multi-unit mounting head to pick up the second selected electronic component and then mount the second selected electronic component onto the board in face-up status.

9. An electronic component mounting method of claim 1, further comprising providing a mounting head and a take-out head;

providing a nozzle replacement mechanism including a plurality of replacement nozzles that are detachably mountable on the mounting head, the plurality of replacement nozzles comprising a first replacement nozzle and a second replacement nozzle;

said picking up and flipping of the first selected electronic component comprises operating the take-out head to pick up and flip the first selected electronic component;

said mounting of the first selected electronic component comprises fitting the second replacement nozzle to the mounting head and operating a mounting head so that the second replacement nozzle receives the first selected electronic component from the take-out head and then mounts the first selected electronic component onto a board in the face-down status; and said picking up and mounting of the second selected electronic component comprises fitting the first replacement nozzle to the mounting head and operating the mounting head so that the first replacement nozzle picks up the second selected electronic component and then mounts the second selected electronic component onto the board in face-up status.

10. The electronic component mounting method of claim 1, wherein said mounting of the first selected electronic component at the first target location is carried out so that the first selected electronic component is mounted in the face-down status at on a board; and subsequent to said mounting of the first selected electronic component on the board, said mounting of the second electronic component at the second target location is carried out so that the second selected electronic component is mounted in the face-up status on top of the first selected electronic component.

11. An electronic component mounting method for mounting electronic components in face-up and face-down conditions to a board, said electronic component mounting method comprising:

operating a take-out suction nozzle to pick up a first selected electronic component supplied in face-up status, rotating the take-out suction nozzle to flip the first selected electronic component over so that the first selected electronic component is placed in a face-down status, and operating a mounting head suction arrangement to receive the first selected electronic component from the take-out suction nozzle and then mount the first selected electronic component at a first target location in the face-down status; and operating the mounting head suction arrangement to pick up a second selected electronic component supplied in face-up status and mount the second selected electronic component to a second target location in the face-up status.

12. An electronic component mounting method of claim 11, wherein said supplying of the first selected electronic component to the common pick up position comprises positioning a first electronic component-holding section of the part feeder by rotating the first electronic component-holding section about a shaft; and said supplying of the second selected electronic component to the common pick up position comprises positioning a second electronic component-holding section of the part feeder by rotating the second electronic component-holding section about the shaft.

13. The electronic component mounting method of claim 12, further comprising operating a first camera to obtain an image of one of the first and second selected electronic components while the one of the first and second electronic components is held on the part feeder;

recognizing a position of the one of the first and second electronic components held on the part feeder based on the image obtained by the first camera, and producing a first recognition result;

operating a second camera to obtain an image of the first selected electronic component while the first selected electronic component is held by the mounting head;

recognizing a position of the first electronic component held by the mounting head based on the image obtained by the second camera, and producing a second recognition result; and controlling the part feeder based on the first recognition result, and correcting a traveling amount of the mounting head based on the second recognition result.

* * * * *